(12) United States Patent  (10) Patent No.: US 9,180,386 B2
Falson et al.  (45) Date of Patent: Nov. 10, 2015

(54) ADDITIVE FOR THE CRYSTALLIZATION OF PROTEINS, USE AND PROCESS

(75) Inventors: Pierre G. Falson, Annonay (FR); Anthony W. Coleman, Caluire (FR); Rachel Rima Matar Merheb, Saint Genis Laral (FR); Antoine Leydier, Bagnols-sur-Ceze (FR); Frederic Huche, La Ferte-Allais (FR)

(73) Assignees: CENTRE NATIONAL DE LA RECHERCHE SCIENTIFIQUE—CNRS—, Paris (FR); UNIVERSITE CLAUDE BERNARD LYON 1, Villeurbanne (FR)

( * ) Notice: Subject to any disclaimer, the term of this patent is extended or adjusted under 35 U.S.C. 154(b) by 1070 days.

(21) Appl. No.: 13/263,032

(22) PCT Filed: Apr. 2, 2010

(86) PCT No.: PCT/FR2010/000285
§ 371 (c)(1),
(2), (4) Date: Jan. 24, 2012

(87) PCT Pub. No.: WO2010/116055
PCT Pub. Date: Oct. 14, 2010

(65) Prior Publication Data
US 2012/0123088 A1 May 17, 2012

(30) Foreign Application Priority Data
Apr. 6, 2009 (FR) ...................................... 09/01678

(51) Int. Cl.
*C30B 29/54* (2006.01)
*B01D 9/00* (2006.01)
*C30B 7/14* (2006.01)
*C30B 29/58* (2006.01)

(52) U.S. Cl.
CPC ... *B01D 9/00* (2013.01); *C30B 7/14* (2013.01); *C30B 29/58* (2013.01)

(58) Field of Classification Search
CPC ............ C30B 29/54; C30B 29/58; C30B 7/14
See application file for complete search history.

(56) References Cited

U.S. PATENT DOCUMENTS

2009/0233941 A1* 9/2009 Coleman et al. ......... 514/252.14
2011/0144314 A1   6/2011 Coleman et al.

OTHER PUBLICATIONS

Franca Jones et al., "Bio-Inspired Calix[4]arene Additives for Crystal Growth Modification of Inorganic Materials", Crystal Growth & Design, Dec. 10, 2005, vol. 5, No. 6, pp. 2336-2343.
Martin Caffrey, "Membrane Protein Crystallization", Journal of Structural Biology, 2003, vol. 142, pp. 108-132.
(Continued)

*Primary Examiner* — Robert M Kunemund
(74) *Attorney, Agent, or Firm* — Arent Fox LLP

(57) ABSTRACT

The present invention relates to the use and to a process involving at least one calix[n]arene derivative substituted by at least one acid functional group on the upper face and at least one aliphatic chain of variable length on the other face, as an additive for crystallization of a polar and/or positively charged molecule. The use and the process of the present invention have the advantage of enabling, facilitating and/or accelerating the crystallization of polar and/or positively charged molecules, especially of membrane proteins that are in solution or soluble, which had previously proved to be very difficult.

9 Claims, 11 Drawing Sheets

(56) References Cited

OTHER PUBLICATIONS

Tatsuya Oshima et al., "Selective Extraction and Recovery of Cytochrome c by Liquid-Liquid Extraction Using a Calix[6]arene Carboxylic Acid Derivative", Langmuir, American Chemical Society, Jun. 2005, vol. 21, No. 16, pp. 7280-7284.

M. Martínez-Aragón et al., "Host-Guest Extraction of Immunoglobulin G Using Calix[6]arenas", Separation and Purification Technology, Elsevier Science, Mar. 26, 2008, pp. 1-6.

R. Michael Garavito et al., "Detergents as Tools in Membrane Biochemistry", *J Biol Chem*, 2001, vol. 276, No. 35, pp. 32403-32406.

Peter Nollert et al., "Membrane protein crystallization in amphiphile phases: practical and theoretical considerations" *Prog Biophys Mol Biol.* 2005, vol. 88, pp. 339-357.

Lundstrom K., "Structural genomics on membrane proteins: the MePNet approach", Curr Opin Drug Discov Devel., May 2004, vol. 7(3), pp. 342-346 (Abstract only).

Michael Dean et al., "The Human ATP-Binding Cassette (ABC) Transporter Superfamily", Genome Research, 2001, vol. 11, pp. 1156-1166.

Thomas Efferth et al., "Adenosine triphosphate-binding cassette transporter genes in ageing and age-related diseases", Ageing Res Rev, 2003, vol. 2, pp. 11-24.

R. B. Kim, "Drug transporters in HIV Therapy", Top HIV Med, 2003, vol. 11, pp. 136-139.

Asha Rajagopal et al., "Subcellular Localization and Activity of Multidrug Resistance Proteins" Mol Biol Cell, Aug. 2003, vol. 14, pp. 3389-3399.

Achène Boumendjel et al., "Anticancer Multidrug Resistance Mediated by MRP1: Recent Advances in the Discovery of Reversal Agents", Med Res Rev, 2005, vol. 25, No. 4, pp. 453-472.

Annie Frelet et al., "Insight in eukaryotic ABC transporter function by mutation analysis", FEBS Letters, 2006, vol. 580, pp. 1064-1084.

Yoshiyuki Shirasaka et al., "Evaluation of Human P-Glycoprotein (MDR1/ABCB1) ATPase Activity Assay Method by Comparing with in Vitro Transport Measurements: Michaelis-Menten Kinetic Analysis to Estimate the Affinity of P-Glycoprotein to Drugs", Biol Pharm Bull, 2006, vol. 29, No. 12, pp. 2465-2471.

Gergely Szakács et al., "Targeting multidrug resistance in cancer", Nat Rev Drug Discovery, 2006, vol. 5, pp. 219-234.

Junichi Enokizono et al., "Quantitative Investigation of the Role of Breast Cancer Resistance Protein (Bcrp/Abcg2) in Limiting Brain and Testis Penetration of Xenobiotic Compounds", Drug Metab Dispos, 2008, vol. 36, No. 6, pp. 995-1002.

Alexander McPherson et al., "Searching for silver bullets: An alternative strategy for crystallizing macromolecules", J Struct Biol, 2006, vol. 156, pp. 387-406.

Mohamed Chami et al., "Three-dimensional Structure by Cryo-electron Microscopy of YvcC, an Homodimeric ATP-binding Cassette transporter from Bacillus subtilis", J Mol Biol, 2002, vol. 315, pp. 1075-1085.

Laemmli U. K., "Cleavage of structural proteins during the assembly of the head of bacteriophage T4", Nature, 1970, vol. 227, pp. 680-685 (Abstract only).

Smith P. K. et al., "Measurement of protein using bicinchoninic acid", Anal Biochem, 1985, vol. 150(1), pp. 76-85 (Abstract only).

Guillaume Lenoir et al. "Overproduction in yeast and rapid and efficient purification of the rabbit SERCA1a Ca2+-ATPase", Biochim Biophys Acta, vol. 1560, pp. 67-83.

\* cited by examiner

ADDITIVE FOR THE CRYSTALLIZATION OF PROTEINS, USE AND PROCESS

CROSS-REFERENCE TO RELATED APPLICATIONS

This application is a National Stage entry of International Application No. PCT/FR2010/000285, filed Apr. 2, 2010, which claims priority to French Patent Application No. 09/01678 filed Apr. 6, 2009, the disclosure of the prior application are incorporated in their entirety by reference.

SEQUENCE LISTING

The instant application contains a Sequence Listing which has been submitted in ASCII format via EFS-Web and is hereby incorporated by reference in its entirety. Said ASCII copy, created on Dec. 29, 2011, is named 21305356.txt and is 5,870 bytes in size.

TECHNICAL FIELD

The present invention relates to the use and to a process involving at least one calix[n]arene derivative substituted with at least one acid function on the upper face and at least one variable-length aliphatic chain on the other face, as an additive for the crystallization of a polar and/or positively charged molecule.

The present invention concerns, for example, the production and marketing of a crystallization kit.

In the description below, the references in brackets ([ ]) refer to the list of references presented at the end of the text.

PRIOR ART

X-ray diffraction is the method most commonly used for determining the spatial structure of proteins at the atomic scale, with, to date, more than 47 500 structures resolved out of a total of 55 000 (source Protein Data Bank: www.rcsb.org/pdb/statistics).

This method requires the production of the protein in a crystalline state, which is an indispensable step that is relatively easy to overcome for soluble proteins, but particularly difficult for membrane proteins (Caffrey M. (2003) Membrane protein crystallization. *J Struct Biol* 142, 108-32 [1]). Specifically, there are more than 15 000 non-redundant soluble protein structures and less than only 200 non-redundant membrane protein structures.

The difficulty in crystallizing membrane proteins arises mainly from two problems that are intrinsic to proteins of this type.

A first problem is the difficulty in obtaining a population of extracted and stabilized membrane proteins in solution with structurally homogeneous detergents.

The use of detergent is necessary firstly to extract these proteins from their membrane environment (Garavito R. M. and Ferguson-Miller S. (2001) Detergents as Tools in Membrane Biochemistry. *J Biol Chem* 276, 32403-6 [2]) and secondly to maintain them in solution for several weeks. However, these detergents do not have the same physicochemical characteristics as lipids and thus have a tendency to destabilize the structure of the membrane domains, which is a source of structural heterogeneity.

Another problem is that the formation of protein-protein contacts, which are necessary for their crystallization, is markedly disfavored in the case of membrane proteins (Nollert P. (2005) Membrane protein crystallization in amphiphile phases: practical and theoretical considerations. *Prog Biophys Mol Biol* 88, 339-57 [3]).

Detergents are once again the culprits, since, in order to maintain in solution the membrane protein extracted from the membranes, they mask the lipophilic region of said protein. This leads to the formation of a crown around the membrane domain, the size of which is large enough to prevent the hydrophilic regions from creating the protein-protein contacts that are necessary for the formation and stabilization of crystals.

The value as regards membrane proteins is particularly great. They represent about 30% of the proteome, all organisms taken together, and are thus largely under-represented in the Protein Data Bank. Even more importantly, they represent in man 70% of the therapeutic targets (Lundstrom K. (2004) Structural genomics on membrane proteins: the MePNet approach. *Curr Opin Drug Discov Devel* 7, 342-6 [4]), in particular the family of ABC transporters with multiple resistance to chemotherapeutic agents (Dean M., Haman Y. and Chimini G. (2001) The human ATP-binding cassette (ABC) transporter superfamily. *J Lipid Res* 42, 1007-17 [5]; Efferth T. (2003) Adenosine triphosphate-binding cassette transporter genes in ageing and age-related diseases. *Ageing Res Rev* 2, 11-24 [6]; Kim R. B. (2003) Drug transporters in HIV Therapy. *Top HIV Med* 11, 136-9 [7]; Rajagopal A. and Simon S. M. (2003) Subcellular localization and activity of multidrug resistance proteins. *Mol Biol Cell* 14, 3389-99 [8]; Boumendjel A., Baubichon-Cortay H., Trompier D., Perrotton T. and Di Pietro A. (2005) Anticancer multidrug resistance mediated by MRP1: recent advances in the discovery of reversal agents. *Med Res Rev* 25, 453-72 [9]; Frelet A. and Klein M. (2006) Insight in eukaryotic ABC transporter function by mutation analysis. *FEBS Lett* 580, 1064-84 [10]; Shirasaka Y., Onishi Y., Sakurai A., Nakagawa H., Ishikawa T. and Yamashita S. (2006) Evaluation of Human P-Glycoprotein (MDR1/ABCB1) ATPase Activity Assay Method by Comparing with in Vitro Transport Measurements: Michaelis-Menten Kinetic Analysis to Estimate the Affinity of P-Glycoprotein to Drugs. *Biol Pharm Bull* 29, 2465-71 [11]; Szakacs G., Paterson J. K., Ludwig J. A., Booth-Genthe C. and Gottesman M. M. (2006) Targeting multidrug resistance in cancer. *Nat Rev Drug Discov* 5, 219-34 [12]; Enokizono J., Kusuhara H., Ose A., Schinkel A. H. and Sugiyama Y. (2008) Quantitative Investigation of the Role of Breast Cancer Resistance Protein (Bcrp/Abcg2) in Limiting Brain and Testis Penetration of Xenobiotic Compounds. *Drug Metab Dispos*, dmd. 107.019257 [13]).

In practical terms, it is established that small molecules make it possible to improve the probability of crystallization of proteins (McPherson A. and Cudney B. (2006) Searching for silver bullets: an alternative strategy for crystallizing macromolecules. *J Struct Biol* 156, 387-406 [14]). Several additive kits, such as detergent-based kits, have been marketed in recent years, especially by Hampton Research (business name) or Jena Biosciences (business name). They are visibly of limited efficacy, since the number of membrane proteins crystallized has not substantially increased since they have been marketed.

There is thus a real need to develop additives that promote the crystallization of polar and/or positively charged molecules, especially membrane proteins, and that overcome the defects, drawbacks and obstacles of the prior art. It is also necessary to develop an efficient process for the crystallization of polar and/or positively charged molecules, especially membrane proteins.

DESCRIPTION OF THE INVENTION

The present invention precisely satisfies all of the above-mentioned technical problems and drawbacks of the prior art by using at least one calix[n]arene derivative substituted with at least one acid function on the upper face and at least one variable-length aliphatic chain on the other face, as an additive for the crystallization of a polar and/or positively charged molecule, and by providing a process involving this calix[n]arene derivative.

The present invention relates especially to the use of at least one calix[n]arene derivative, n being an integer ranging from 4 to 12, substituted with at least one acid function on one face and at least one aliphatic chain on the other face, as an additive for crystallization of a polar and/or positively charged molecule.

The term "crystallization" means a physical operation that consists in isolating a product in solution, by passing from a liquid, gaseous or solid disordered state to a solid ordered state.

The term "crystallization of proteins" means a method that promotes the ordered stacking in the 3 dimensions of space of a homogeneous population of protein polymers having a common conformation, and leading to the formation of a crystal. Proteins differ from minerals in the sense that they are infinitely more complex, polyatomic polymers, composed of carbon, hydrogen, oxygen, nitrogen and also possibly sulfur.

The term "calixarene" means a cyclic macromolecule forming a hydrophobic cavity.

The term "calix[n]arene derivative" means a calixarene composed of n arene rings.

The term "acid function" means a function that donates hydrogen ions. For example, the acid function may be a carboxylic acid group (—COOH), a group —$(CH_2)_y$—COOH in which y is an integer ranging from 1 to 12, or a benzoic acid (—$C_6H_4$—COOH).

The term "aliphatic chain" means a linear or branched, cyclic or acyclic, saturated or unsaturated carbon-based chain. For example, the aliphatic chain may be linear, for example a group —$(C_mH_{2m+1})$ in which m is an integer ranging from 1 to 12, for example a methyl, ethyl, propyl, butyl, pentyl, hexyl, heptyl, octyl, nonyl, decyl, undecyl, dodecyl, tetradecyl, hexadecyl or octadecyl group. The aliphatic chain may also be branched, for example it may be a methylpropane, 2-methylbutane, 2,2-methylpropane, 2-methylpentane, 3-methylpentane, 2,2-dimethylbutane, 2,3-dimethylbutane, 2-methylhexane, 3-methylhexane, 3-ethyl-pentane, 2,2-dimethylpentane, 2,3-dimethylpentane, 2,4-dimethylpentane, 2,2,3-trimethylbutane, 2-methylheptane, 3-methylheptane, 4-methylheptane, 3-ethylhexane, 2,2-dimethylhexane, 3,3-dimethylhexane or 2,3-dimethylhexane group. The aliphatic chain may also be unsaturated, for example it may be a propene, pentene, hexene, heptene, octene, nonene, decene, undecene, dodecene, tetradecene, hexadecene or octadecene group containing one or more unsaturations, independently of cis or trans type.

The term "additive" means a compound introduced into a solution or a mixture, which affords a specific property.

The term "polar molecule" means a molecule whose barycenters of positive and negative charge do not converge. For example, the polar molecule may be a protein, for example a soluble protein or a membrane protein. For example, the polar molecule may be a whole protein or correspond to fragments or domains thereof.

The term "positively charged molecule" means a molecule bearing at least one positive charge in solution. For example, the positively charged molecule may be a protein, for example a soluble protein or a membrane protein. For example, the positively charged molecule may be a whole protein or correspond to fragments or domains thereof.

The at least one calix[n]arene derivative may correspond, for example, to formula (I) below:

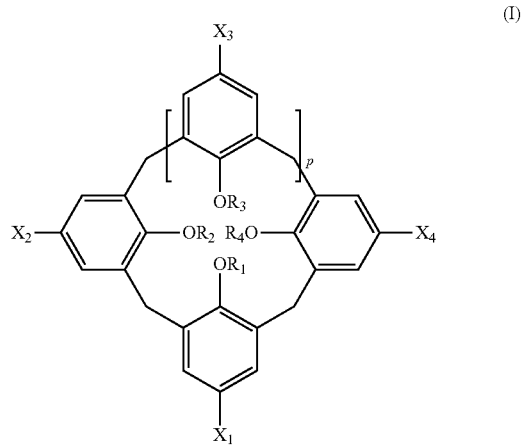

in which:
p is an integer ranging from 1 to 9;
$R^1$, $R^2$, $R^3$ and $R^4$ represent, independently of each other, a hydrogen or one of the abovementioned aliphatic chains. It may be, for example, a linear or branched group —$(C_mH_{2m+1})$, in which m is an integer ranging from 1 to 12 or equal to 16 or 18;
$X^1$, $X^2$, $X^3$ and $X^4$ represent, independently of each other, a hydrogen atom or one of the abovementioned acid functions. It may be, for example, a carboxylic group or a group —$(CH_2)_y$—COOH in which y is an integer ranging from 1 to 12.

For example, the at least one calix[n]arene derivative may correspond to formula (I) in which:
p is an integer equal to 1;
a radical from among $R^1$, $R^2$, $R^3$ and $R^4$ represents a linear or branched group —$(C_mH_{2m+1})$ in which m is an integer between 1 and 12 inclusive or is equal to 16 or 18;
three radicals from among $R^1$, $R^2$, $R^3$ and $R^4$ represent a hydrogen atom;
a radical from among $X^1$, $X^2$, $X^3$ and $X^4$ represents a hydrogen atom;
three radicals from among $X^1$, $X^2$, $X^3$ and $X^4$ represent a carboxylic group or a group —$(CH_2)_y$—COOH in which y is an integer ranging from 1 to 12.

By way of example, according to formula I above, when n is 4, p is 1. If n is 6, p is 3, etc.

The group —$(C_mH_{2m+1})$ may be chosen, for example, from the group comprising methyl, ethyl, propyl, butyl, pentyl, hexyl, heptyl, octyl, nonyl, decyl, undecyl and dodecyl groups.

For example, the polar and/or positively charged molecule may be chosen from the group comprising proteins, peptides, protein complexes, protein domains, glycoproteins and phosphoglycoproteins.

The term "protein" means a linear polymer of amino acids bonded via covalent peptide bonding.

The term "peptide" means a linear polymer of amino acids bonded covalently via peptide bonding of 2 to 100 amino acids.

The term "protein complexes" means a homo- or hetero-oligomeric assembly of proteins of soluble or membrane nature.

The term "protein domain" means a spatially folded and functional protein element of a protein.

The polar and/or positively charged molecule may be, for example, a membrane protein or a soluble protein, in whole form or fragments or domains thereof. The protein fragments or domains may be produced, for example, via controlled enzymatic digestion or via molecular biology, for example by genetic recombination.

The term "protein fragment" means a peptide element, which is not necessarily spatially folded and functional, of a protein.

The term "soluble protein" means a protein that is miscible in aqueous solution, in aqueous physiological medium and that can diffuse freely.

The term "membrane protein" means a protein associated with biological membranes, either anchored or integral, and that cannot diffuse freely in aqueous media and is unstable in these media.

Membrane proteins are often classified as a function of the structures that enable them to interact with membranes and the way in which these structures are arranged. Membrane proteins may be polytope proteins or monotope proteins.

The term "polytope proteins" means proteins that cross the membrane one or more times.

The term "monotope proteins" means proteins that interact with only one side of the membrane.

Membrane proteins may also be classified as a function of their difficulty of extraction from the membranes. They may be integral or peripheral.

The term "integral proteins" means monotope or polytope proteins that interact strongly with the membrane, especially via hydrophobic interactions. These proteins are also known as "intrinsic proteins".

The term "peripheral proteins" means monotope proteins that interact weakly with the membrane, i.e. either via electrostatic bonds or by means of other membrane proteins. These proteins are also known as "extrinsic proteins".

For example, the membrane protein may be chosen from the group comprising protein G receptors, channels, symporters, antiporters, electron transporters, protons, anion pumps, cation pumps, metal pumps, peptide pumps, or efflux pumps of the BmrA type. The polar and/or positively charged molecule may also be one of the various versions of primary structure modified and/or generated by molecular biology, for example $H_6$BmrA.

For example, the membrane protein is extracted beforehand from the membrane via extraction techniques that are standard to those skilled in the art.

The polar and/or positively charged molecule may be, for example, any natural or native protein, which may or may not have undergone post-translational modifications, of any species or any artificial protein.

The term "natural protein" means a protein produced by an organism or a cell whose DNA has been modified by genetic recombination.

The term "native protein" means a protein that is in the functional and structurally correctly folded state.

The term "post-translational modifications" means modifications made to a protein after synthesis: glycosylation, farnesylation, phosphorylation, GPI anchor, acylations, proteolyses, addressing.

For example, the protein may be a recombinant protein. The term "recombinant protein" means a protein produced by an organism or a cell in which a sequence coding for the protein has been introduced so as to make said protein be expressed by this organism or this cell.

The protein species defined above may be produced in an organism of natural origin, in a host organism or in a recombinant acellular system, via chemical or semichemical synthesis.

The present invention also relates to a process for the crystallization of a polar and/or positively charged molecule, comprising a step of placing in contact:
  a. an aqueous solution comprising a molecule to be crystallized and
  b. at least one calix[n]arene derivative, in which n is 4, substituted with at least one acid function on one face and at least one aliphatic chain on the other face.

The calix[n]arene derivatives, the polar molecule, the aliphatic chain and the polar and/or positively charged molecule are defined above.

For example, the polar and/or positively charged molecule is purified beforehand, for example by chromatography.

In the case of crystallization of membrane proteins, the process of the present invention may include, for example, a preliminary step of extraction of these membrane proteins. This step may be an extraction that is standard to those skilled in the art. It may especially include the use of standard detergents.

The placing in contact of the process of the present invention may be performed, for example, at a pH of between 5.0 and 14.0, for example between 6 and 9, as a preferred narrower range, for example between 6.5 and 8.5 as a preferred range, for example at a pH equal to 8.0 as an optimum value.

The placing in contact of the process of the present invention may be performed, for example, at a temperature of between −40° C. and 80° C., for example between 4° C. and 40° C., for example between 15° C. and 30° C., for example at a temperature of 20° C.

The placing in contact of the process of the present invention may be performed, for example, at a calixarene concentration of between 1 nM and 100 mM, for example between 0.1 mM and 10 mM, for example between 1 and 10 mM, for example at a concentration equal to 1 mM.

To the detriment of all the techniques of the prior art, the present invention makes it possible to promote, i.e. to enable, facilitate and/or accelerate, the crystallization of polar and/or positively charged molecules, especially membrane proteins in solution or that are soluble, which hitherto have been very difficult to crystallize. The crystallization is especially improved by means of the formation of an organized aggregation state of the polar and/or positively charged molecules in space, leading to the formation of crystals.

In particular, the present invention advantageously enables the calix[n]arene derivatives to become organized so as to generate supramolecular lumps that expose on their surface the acid functions, maintained by the hydrophobic region of the aliphatic chains, for example, as illustrated in FIG. 1B.

The term "supramolecular lump of calix[n]arene derivatives" means an organization of several calix[n]arene derivatives of micellar type. These supramolecular lumps become intercalated between the membrane proteins via ionic interactions, for example, as illustrated in FIG. 1C. These interactions make it possible to reinforce the cohesion of the edifice and facilitate its crystalline organization, for example, as illustrated in FIG. 1D. These interactions apply with the same efficacy to all the polar and/or positively charged molecules.

The use and the process of the present invention may, for example, involve several calix[n]arene derivatives defined above. In particular, it may be particularly advantageous to use several calix[n]arene derivatives of the present invention with different aliphatic chain lengths. This advantageously makes it possible to generate supramolecular lumps whose size depends on the length of the aliphatic chains of the calix[n]arene derivatives used.

The rate of crystallization of the protein is proportionately faster the shorter the size of the aliphatic chain of the calix[n] arene used (FIGS. 3A-E). The longest derivatives in any case promote crystallization of the protein faster than in the absence thereof (FIGS. 4A-B).

Providing supramolecular lumps of different sizes allows better adjustment of these lumps in the vacant spaces between neighboring membrane proteins. The crystallization of membrane proteins is greatly improved.

The use according to the present invention especially finds an application in the production and marketing of a crystallization kit comprising at least one calix[n]arene derivative of the present invention. This kit may be used in particular in protocols for determining the spatial structure at the atomic scale of proteins of great interest, especially membrane proteins.

Other advantages may also appear to a person skilled in the art on reading the examples below, which are illustrated by the attached drawings, given for illustrative purposes.

BRIEF DESCRIPTION OF THE FIGURES

FIG. 3 represents tests of crystallization of $H_6BmrA$ in the absence or presence of p(HOOC)3Ar4 oX. The concentrations used are such that they correspond to ½×, 1× and 2× the critical micelle concentration of each of the compounds, these compounds having surfactant behavior.

EXAMPLES

Figure 1A:
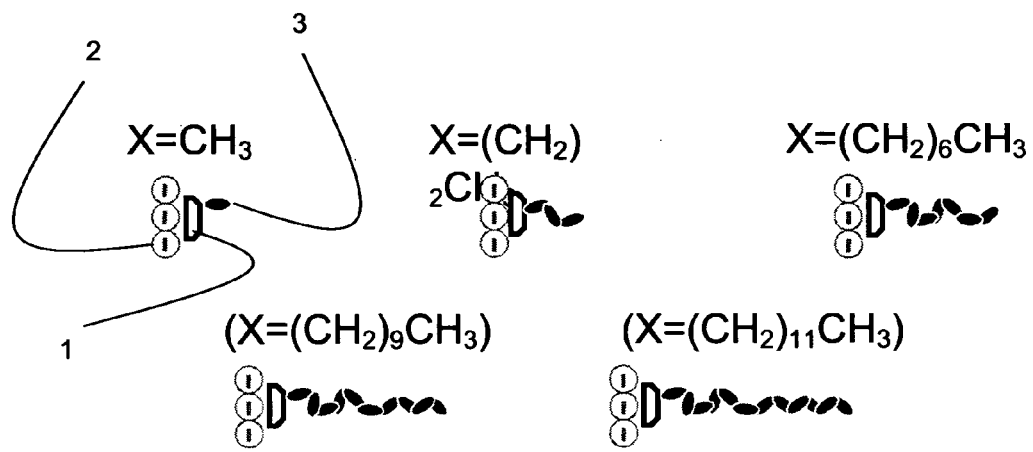
FIG. 1A represents examples of different calix[4]arenes, all formed from a crown of 4 phenols (ring, defined by the number "1") bearing on one face carboxylic groups (small hyphen in a circle, defined by the number "2") and on the other face, an aliphatic chain $C_nH_{2n+1}$, n=1, 3, 7, 10 and 12 (small rods, defined by the number "3").
Figure 1B:
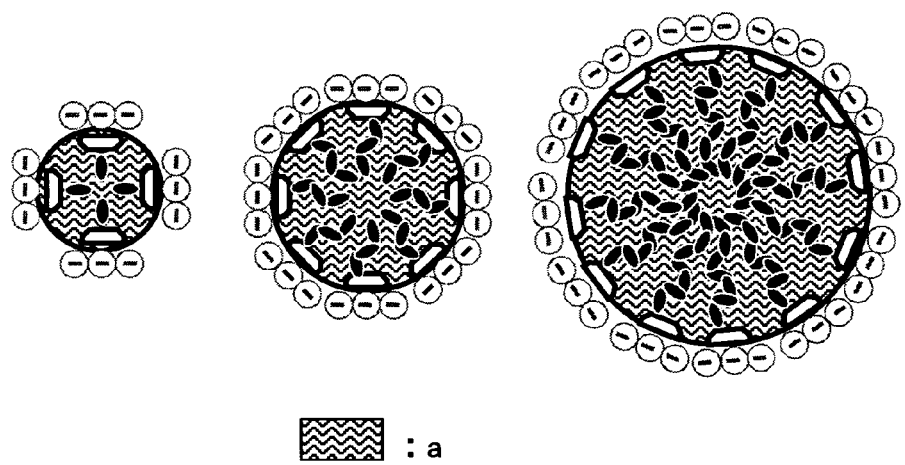
FIG. 1B represents examples of supramolecular organization of these molecules into supramolecular lumps (defined by the letter "a") exposing the charged functions (small hyphen in a circle) at the surface with cohesion maintained by the hydrophobic groups (small rods) grouped together within the lump.
Figure 1C:
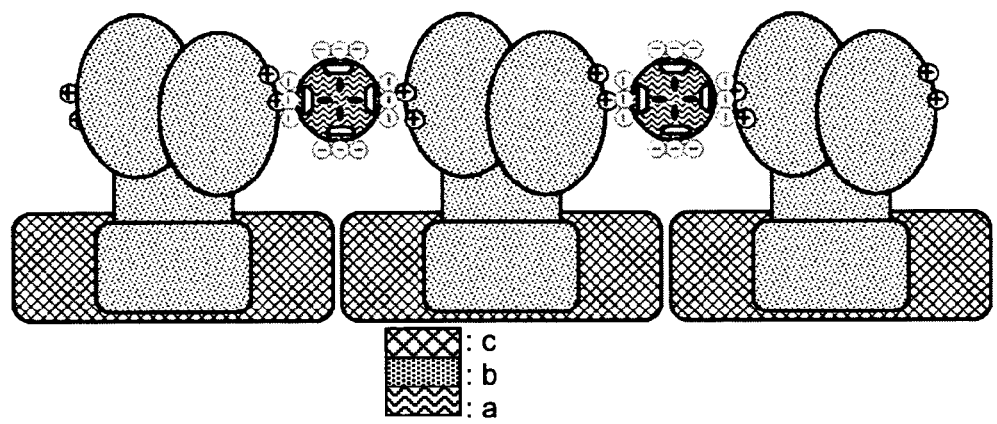
FIG. 1C represents a model of insertion of supramolecular lumps, defined by the letter "a", between membrane proteins, defined by the letter "b", whose hydrophobic regions are surrounded by a crown of detergent, defined by the letter "c".
Figure 1D:
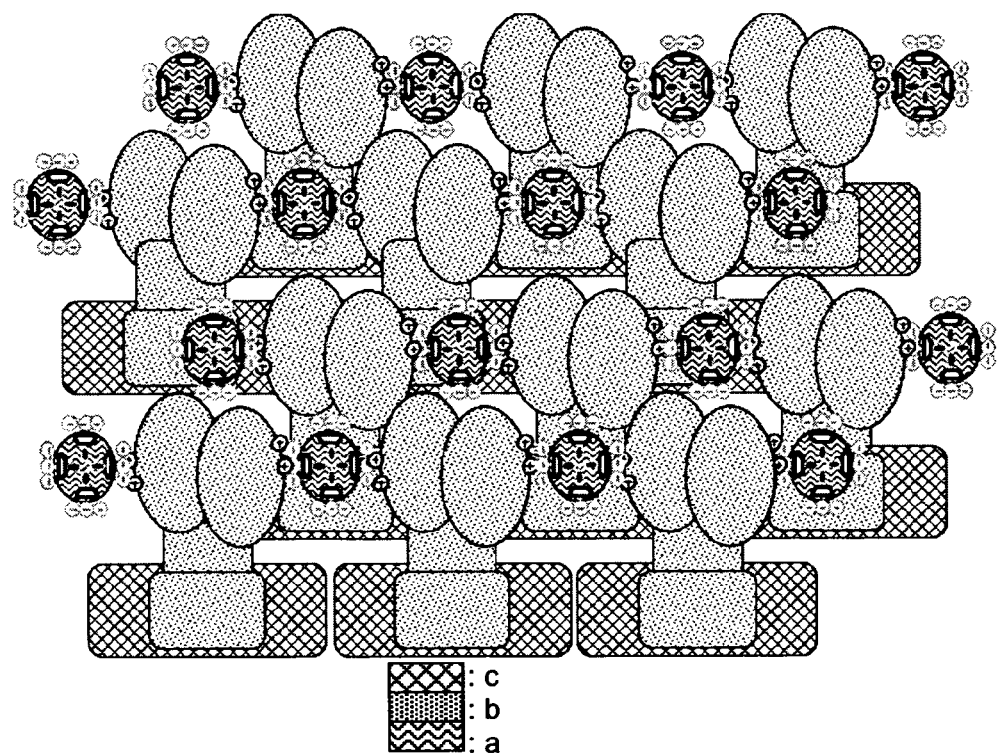
FIG. 1D represents a model of crystalline stacking of lumps-proteins for which the letter "a" represents supramolecular lumps, the letter "b" represents membrane proteins and the letter "c" represents crowns of detergent.

In these examples, the medium 2TY is obtained from the company Bio101 (1070 Joshua Way Vista Calif. 92083 USA), the strain of *Escherichia coli* Bk21-DE3 is obtained from the company Invitrogen SARL BP 96 95613 Cergy Pontoise Cedex, ampicillin, isopropyl-β-thiogalactoside (IPTG) and the reagent bicinchoninic acid (reagent BCA) are obtained from the company Sigma-Aldrich, PO Box 14508, St. Louis, Mo. 63178, UNITED STATES.

Example 1

Cloning, Production and Preparation of the Test Membrane Protein H$_6$BmrA

Cloning

BmrA is a "½" ABC (ATP-Binding Cassette) transporter of *Bacillus subtilis*. It belongs to the family of ABC transporters with multiple resistance to chemotherapeutic agents (Chami M., Steinfels E., Orelle C., Jault J. M., Di Pietro A., Rigaud J. L. and Marco S. (2002) Three-dimensional structure by cryo-electron microscopy of YvcC, an homodimeric ATP-binding cassette transporter from *Bacillus subtilis*. *J Mol Biol* 315, 1075-85 [15]).

BmrA was cloned in the laboratory [15] and is referenced in the Expasy protein data bank by the code O06967 (http://www.expasy.orq/cgi-bin/get-sprot-entry?O06967). Its amino acid sequence is as follows:

```
>tr|O06967|O06967_BACSU Putative uncharacterized
protein yvcC (YvcC protein) OS = Bacillus
subtilis GN = yvcC PE = 3 SV = 1
                                        (SEQ ID No. 1)
MPTKKQKSKSKLKPFFALVRRTNPSYGKLAFALALSVVTTLVSLLIPLLTK

QLVDGFSMSNLSGTQIGLIALVFFVQAGLSAYATYALNYNGQKIISGLREL

LWKKLIKLPVSYFDTNASGETVSRVTNDTMVVKELITTHISGFITGIISVI

GSLTILFIMNWKLTLLVLVVVPLAALILVPIGRKMFSISRETQDETARFTG

LLNQILPEIRLVKASNAEDVEYGRGKMGISSLFKLGVREAKVQSLVGPLIS

LVLMAALVAVIGYGGMQVSSGELTAGALVAFILYLFQIIMPMGQITTFFTQ

LQKSIGATERMIEILAEEEEDTVTGKQIENAHLPIQLDRVSFGYKPDQLIL

KEVSAVIEAGKVTAIVGPSGGGKTTLFKLLERFYSPTAGTIRLGDEPVDTY

SLESWREHIGYVSQESPLMSGTIRENICYGLERDVTDAEIEKAAEMAYALN

FIKELPNQFDTEVGERGIMLSGGQRQRIAIARALLRNPSILMLDEATSSLD

SQSEKSVQQALEVLMEGRTTIVIAHRLSTVVDADQLLFVEKGEITGRGTHH

ELMASHGLYRDFAEQQLKMNADLENKAG
```

The gene corresponding to this sequence of BmrA was modified by polymerase chain reaction (PCR) to include at the N-terminal end a sequence MSSSHHHHHH (SEQ ID No. 2) so as to allow purification of the protein by metal affinity chromatography, and the restriction sites appropriate for introduction into the expression plasmid pET23 (Novagen), using the molecular biology techniques described in *Molecular Cloning, a laboratory manual, second edition*, Sambrook, J., Fritsch, E. F., Maniatis, T., Cold Spring Harbor Laboratory Press, New York.

Culture/Expression

A preculture of 200 mL of medium 2TY, 100 μg/ml of ampicillin is prepared with a strain of *Escherichia coli* BI21-DE3, freshly transformed with the plasmid pET15B-His$_6$-BmrA.

It is incubated for 18 hours at 310 K with stirring at 200 revolutions per minute (rpm). In the morning, the density of the culture OD$_{600\,nm}$ is 0.6. This preculture is used to seed 6 liters of the same medium, at an OD$_{600\,nm}$ of 0.05. When the optical density of the culture reaches a value of 0.6, the expression of His$_6$-BmrA is induced by addition of 0.7 mM of IPTG, and monitored for 3 hours at 298 K.

Fractionation

The bacteria are sedimented by centrifugation at 7500×g for 10 minutes in a Beckman J2-21 centrifuge to form a pellet. The supernatant is removed and the bacteria are then suspended in 50 mM Tris-HCl (tris(hydroxymethyl)aminomethane hydrochloride) pH 8.0 0.5 mM MgCl$_2$, 1 mM dithiothreitol (DTT), antiprotease cocktail (Roche; 1 pastille/50 ml). Thirty units/ml of Benzonase (Sigma) are added and the bacteria are then lyzed by 2 successive passages in a French press (Thermo Electron Corporation, 300 second Ave, Needham Heights, Mass. 02494), at 110 MPa (16 000 psi). Ten millimolar EDTA (ethylenediamine-tetraacetic acid) are then added to the lysate, which is centrifuged for 30 minutes at 15 000×g. The supernatant is conserved and centrifuged for 60 minutes at 200 000×g. The pellet thus obtained, corresponding to the membranes and containing the membrane protein of interest, is suspended in 1.5 mL of 20 mM Tris-HCl buffer, 1 mM EDTA, 0.3 M sucrose, for storage.

The protein concentration is determined by colorimetric titration with the reagent BCA (Smith P. K., Krohn R. I., Hermanson G. T., Mallia A. K., Gartner F. H., Provenzano M. D., Fujimoto E. K., Goeke N. M., Olson B. J. and Klenk D. C. (1985) Measurement of protein using bicinchoninic acid. *Anal Biochem* 150, 76-85 [16]). 0.5 mL aliquots (equivalent to 1 liter of culture) are frozen and stored in liquid nitrogen until the time of use. His$_6$-BmrA represents about 10% of the total protein and 50% of the membrane protein.

Purification

An aliquot of membrane is rapidly thawed and diluted to 2 mg/mL of protein in 20 mM Tris-HCl pH 8.0, 20 mM NaCl, 0.02 mM EDTA, 0.1 mM DTT, antiprotease cocktail (Roche, 1 pastille per 100 mL). His$_6$-BmrA is extracted with 10 mg/mL of foscholine 12 (Anatrace, FC12) for 2 hours at 8° C. with slow rotation. H$_6$BmrA is then separated out by centrifugation for 1 hour at 100 000×g and 283 K. The supernatant is passed through a column of 5 mL of anion exchange, Q-sepharose highflow (GE Healthcare), cleaned beforehand with 2 column-volumes (CV) with the buffer Q$_B$ (20 mM Tris-HCl pH 8.0, 1 M NaCl, 5 mg/mL FC12, antiprotease cocktail: 1 pastille/100 mL) and then equilibrated with 5 CV of buffer Q$_A$ (buffer Q$_B$ without salt).

The solubilizate is loaded at 5 mL/minute and the resin is then washed with 10 CV of buffer Q$_A$. The elution is performed with a linear gradient (Q$_A$-Q$_B$) of NaCl (0-1 M) of 6 CV. The fraction containing H$_6$BmrA is deposited at 5 mL/minute onto a 5 ml metal affinity column of the Nickel-nitriloacetic acid-agarose high trap chelating hp type (GE Healthcare). The resin is pre-equilibrated with 3 CV of buffer Ni$_A$ (20 mM Tris-HCl pH 8.0, 0.2 M NaCl, 10 mM imidazole, 5 mg/mL FC12, antiprotease cocktail: 1 pastille/100 mL).

After loading, the resin is washed with 10 CV of buffer Ni$_A$ and the protein is then eluted with a linear gradient of imidazole (10-250 mM). The fractions containing H$_6$BmrA are pooled and concentrated by ultrafiltration on an Amicon membrane, Ultra4 50 000 (Millipore Corporate Headquarters, 290 Concord Road, Billerica, Mass. 01821, USA) up to a volume of 1 mL.

Finally, the solution is deposited onto a resin of Superdex200 molecular sieves, 10/300 GL (GE Healthcare, Lyons, 13-15 rue des draperies, Les Côteaux de Saône, 69450 Saint Cyr au Mont d'Or) equilibrated with the buffer 20 mM Tris-HCl pH 8.0, 0.1 M NaCl, 3 mg/mL FC12.

Figure 2:
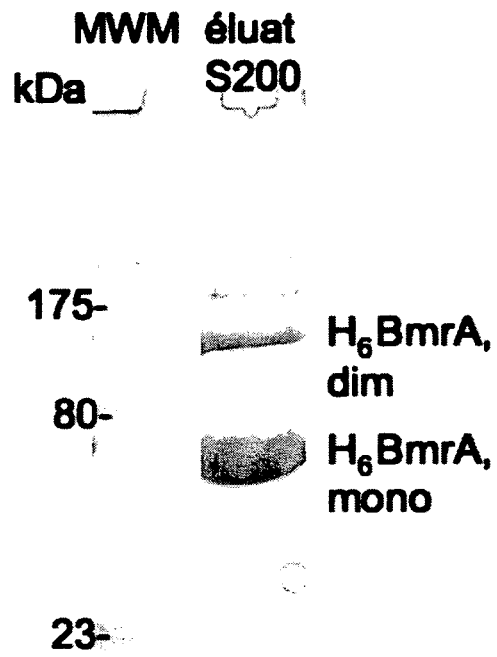
FIG. 2 represents a chromatograph of $H_6BmrA$, after filtration on gel S200, the protein is deposited on 10% SDS-PAGE gel and stained with Coomassie blue. The band defined by "$H_6BmrA$, dim" corresponds to the protein $H_6BmrA$ in dimeric form and the band defined by "$H_6BmrA$, mono" corresponds to the protein $H_6BmrA$ in monomer form.

The fractions containing H$_6$BmrA are pooled and concentrated by ultrafiltration on an Amicon Ultra4 50 000 membrane to a concentration of 11-12 mg/ml. The quality of the purification is monitored at each step by electrophoresis (FIG. 2) of SDS-PAGE type with 10% acrylamide gel (Laemmli U. K. (1970) Cleavage of structural proteins during the assembly of the head of bacteriophage T4. *Nature* 227, 680-5 [17]), by preparing the protein samples as described in (Lenoir G., Menguy T., Corre F., Montigny C., Pedersen P. A., Thinès D., le Maire M. and Falson P. (2002) Overproduction in yeast and rapid and efficient purification of the rabbit SERCA1a $Ca^{2+}$-ATPase. *Biochim Biophys Acta* 1560, 67-83 [18]).

Example 2

Crystallization of $H_6BmrA$

The $H_6BmrA$ crystallization tests are performed using concentrated protein solution in its filtration gel buffer. The solution is supplemented with 5 mM ATP, 5 mM $MgCl_2$, 2 mM sodium orthovanadate. The final protein concentration is 10 mg/mL.

The tests are performed as drops suspended in a 24-well crystallization plate of Linbro type (Hampton Research, 34 Journey, Aliso Viejo, Calif. 92656-3317). Each drop is made by adding, respectively, 2 µl of the protein-solute mixture described above, 0.4 µl of the calix[4]arene prepared previously at a concentration of 10× and neutralized to pH 8.0, and 1.6 µl of a 0.2M $LiNO_3$/22% PEG 2000 MME solution. The reservoir of each well is filled with 500 µl of this solution. The plates are then stored at 18° C. The drops are photographed with an SV11 lens (Zeiss) and a 1.4 Mpx CCD acquisition system, and analyzed with the Zeiss vision image software. The crystals are collected, washed in the reservoir solution and mounted on a cryo loop (Hampton res.) and then frozen and stored in liquid nitrogen. The crystals are analyzed by ESRF, on the ID23-2 microfocus line and the diffraction images generated by an ADSC Quantum 315R CCD detector.

The conditions described in this example are the standard conditions for the crystallization of $H_6BmrA$ and are those used for Examples 3 to 7.

Example 3

Crystallization Tests without Additives (Control)

Figure 3A:
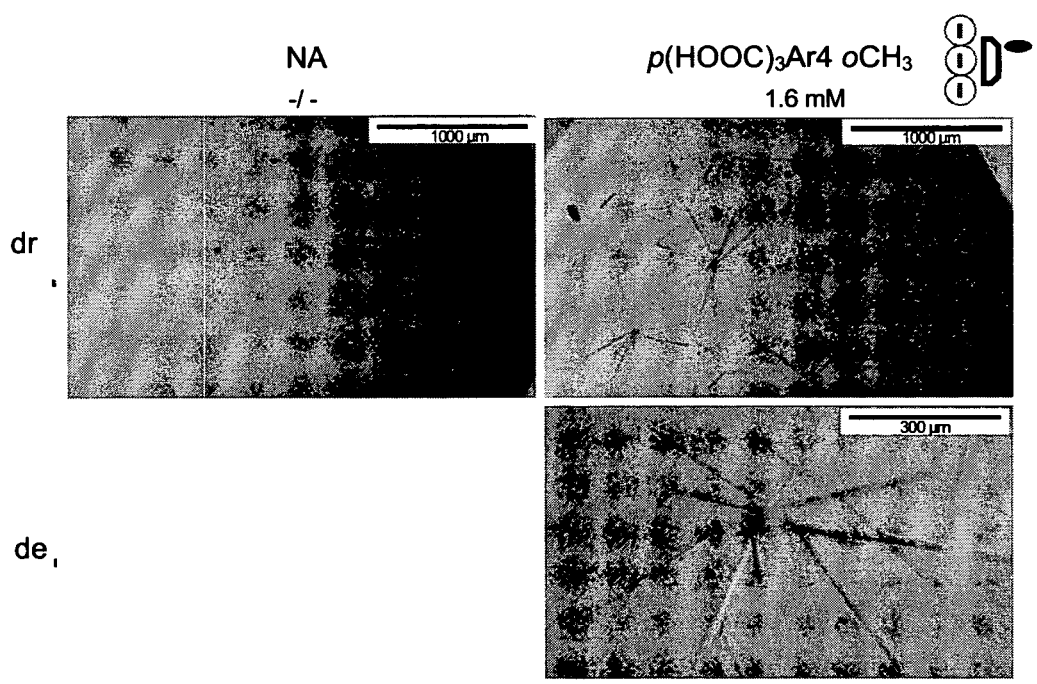
FIGS. 3A to 3E represent drops "dr" and details of these drops "de":
  3A. left-hand panel: in the absence (−/−), right-hand panels: with 1.6 mM p(HOOC)$_3$Ar4 oCH$_3$
  3B. with 0.75 and 1.5 mM of p(HOOC)$_3$Ar4 o((CH$_2$)$_2$CH$_3$)
  3C. with 0.2, 0.4 and 0.8 mM of p(HOOC)$_3$Ar4 o((CH$_2$)$_6$CH$_3$)
  3D. with 0.075, 0.15 and 0.3 mM of p(HOOC)$_3$Ar4 o((CH$_2$)$_9$CH$_3$)
  3E. with 0.04, 0.08 and 0.16 mM of p(HOOC)$_3$Ar4 o((CH$_2$)$_{11}$CH$_3$).
Figure 3B:
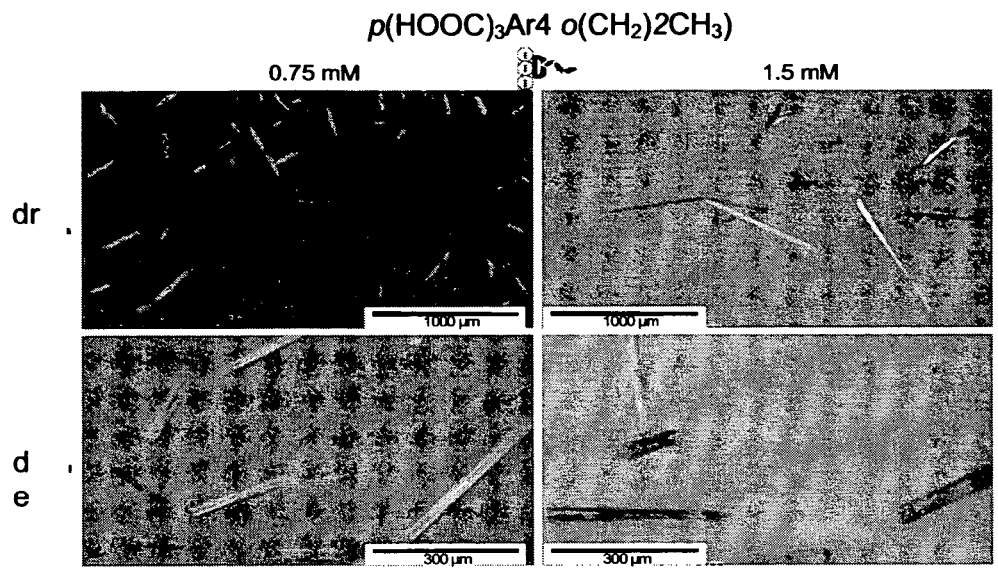
Figure 3C:
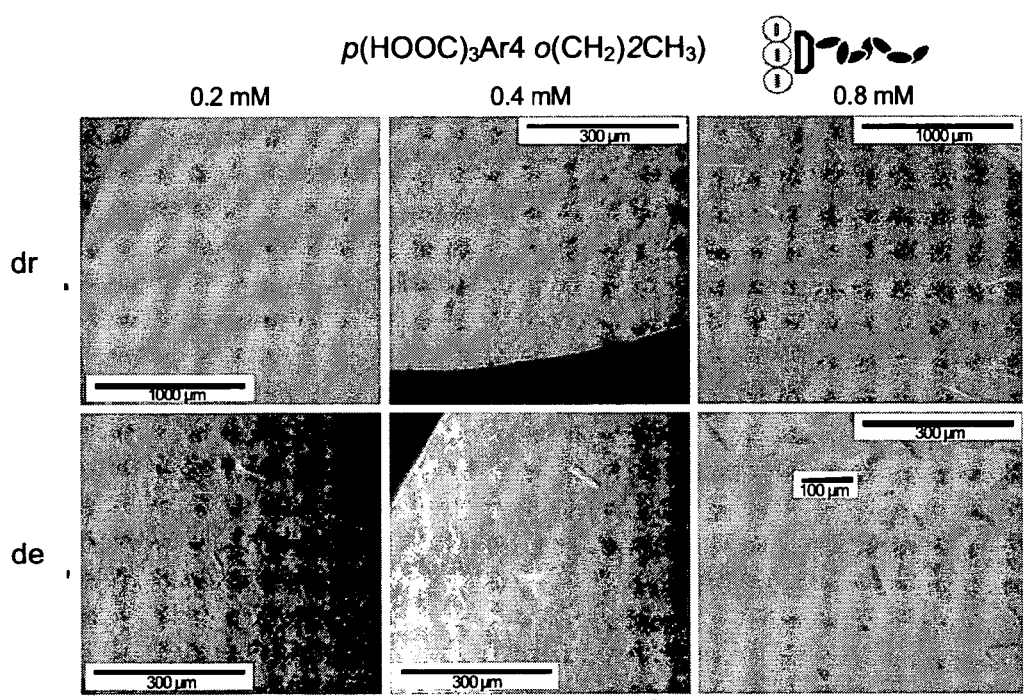
Figure 3D:
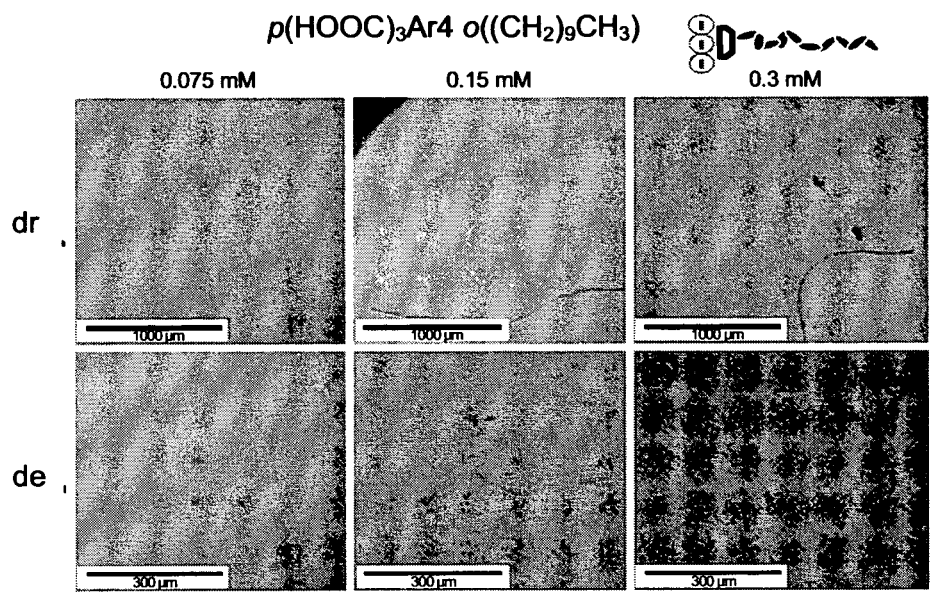
Figure 3E:
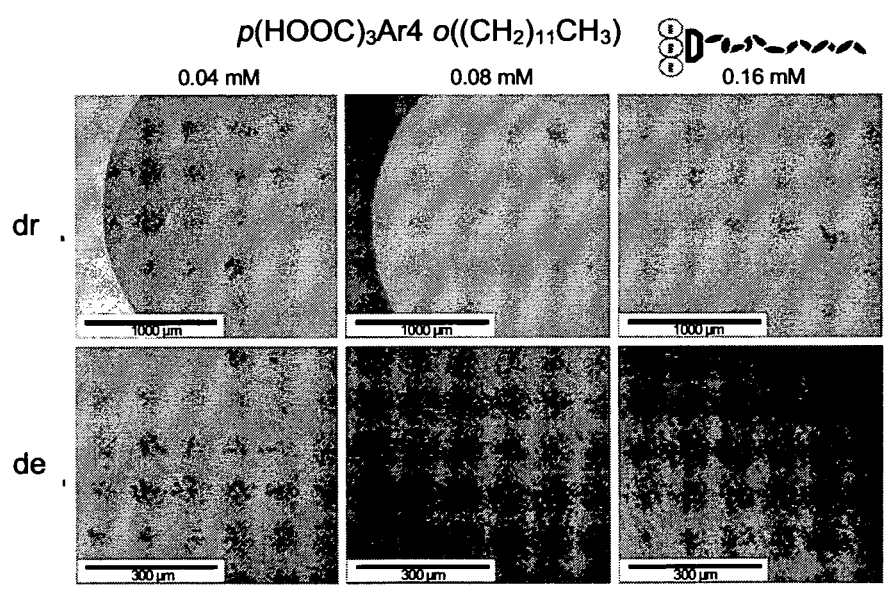

In the absence of calix[4]arene, the standard conditions for the crystallization of $H_6BmrA$ make it possible to obtain protein crystals typically in 3 weeks. Specifically, after 2 days of incubation at 18° C., no crystals are visible in the corresponding drop, as may be seen in the left-hand panel of FIG. 3A.

Example 4

Crystallization Tests with Additives

The presence of calix $p(HOOC)_3Ar4$ oX in the various tests shows, under the same conditions, the presence of numerous crystals, which are well formed and very large, obtained in only 2 days (FIG. 3). The calix[4]arenes that have the shortest aliphatic chains produce the best effects.

Figure 4A:
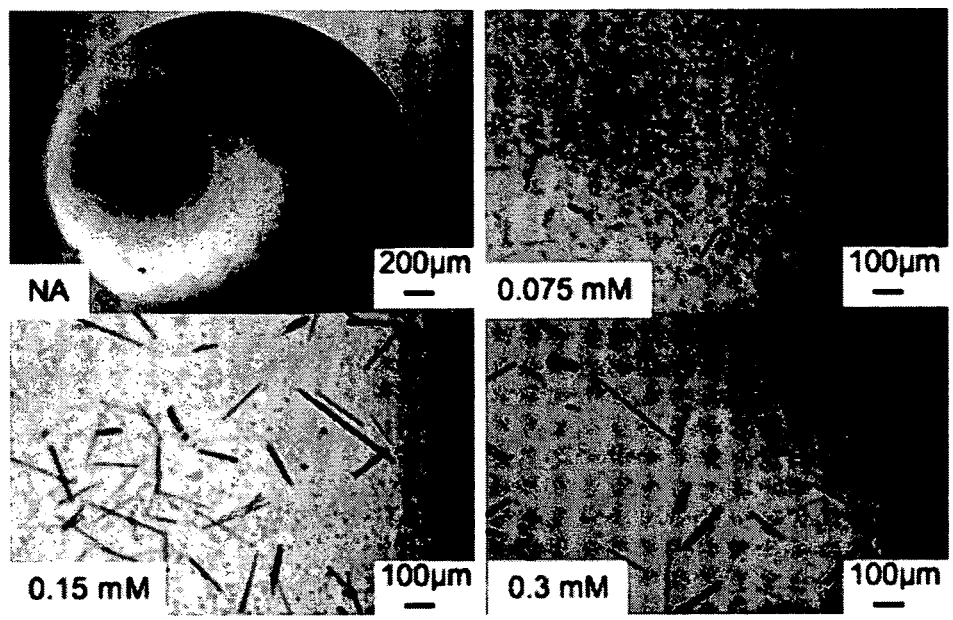
FIG. 4A represents tests of crystallization of $H_6BmrA$ in the absence or presence of p(HOOC)$_3$Ar4 oX. The concentrations used are such that they correspond to ½×, 1× and 2× the critical micelle concentration of each of the compounds, these compounds having surfactant behavior. The top left-hand panel corresponds to the drop deposited in the absence of calixarene derivative.
  4A. with 0.075, 0.15 and 0.3 mM of p(HOOC)$_3$Ar4 o((CH$_2$)$_9$CH$_3$)
  4B. with 0.04, 0.08 and 0.16 mM of p(HOOC)$_3$Ar4 o((CH$_2$)$_{11}$CH$_3$)
Figure 4B:
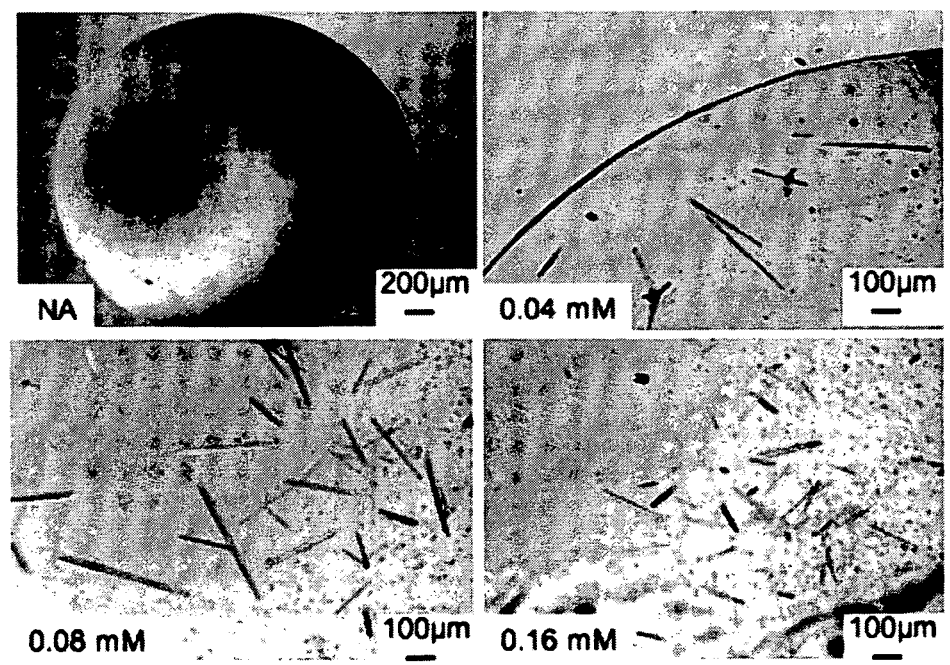
Figure 5A:
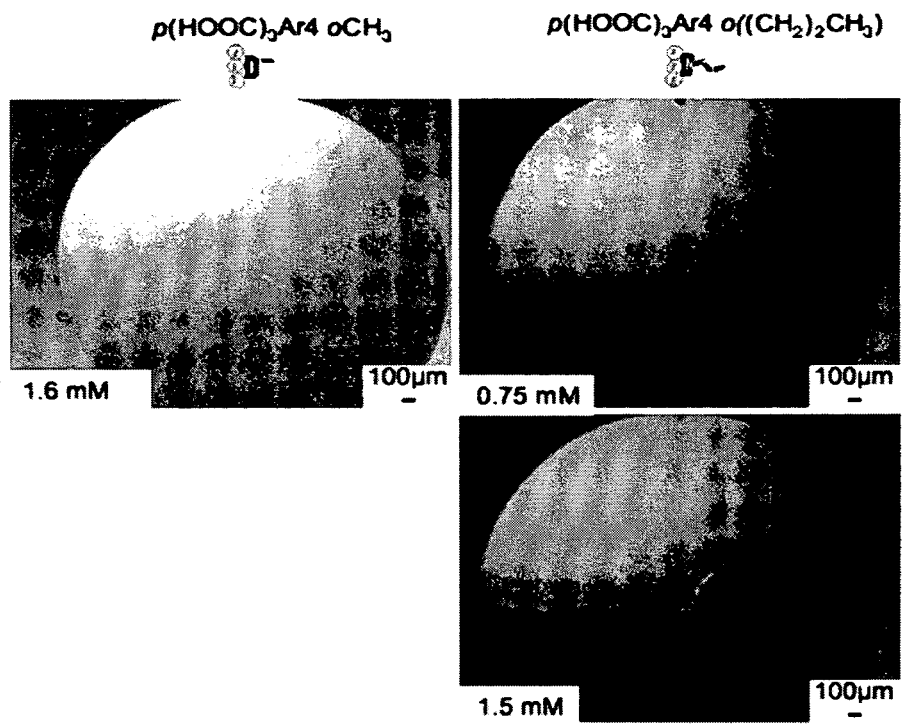
FIG. 5 represents tests of crystallization of $H_6BmrA$ in the absence of proteins and in the presence of p(HOOC)$_3$Ar4 oX. The concentrations used are such that they correspond to ½×, 1× and 2× the critical micelle concentration of each of the compounds, these compounds having surfactant behavior.
  5A. left-hand panel: with 0.16 mM of p(HOOC)$_3$Ar4 oCH$_3$; right-hand panels with 0.75 and 1.5 mM of p(HOOC)$_3$Ar4 o((CH$_2$)$_2$CH$_3$)
  5B. with 0.2, 0.4 and 0.8 mM of p(HOOC)$_3$Ar4 o((CH$_2$)$_6$CH$_3$)
  5C. with 0.075, 0.15 and 0.3 mM of p(HOOC)$_3$Ar4 o((CH$_2$)$_9$CH$_3$)
  5D. with 0.04, 0.08 and 0.16 mM of p(HOOC)$_3$Ar4 o((CH$_2$)$_{11}$CH$_3$).
Figure 5B:
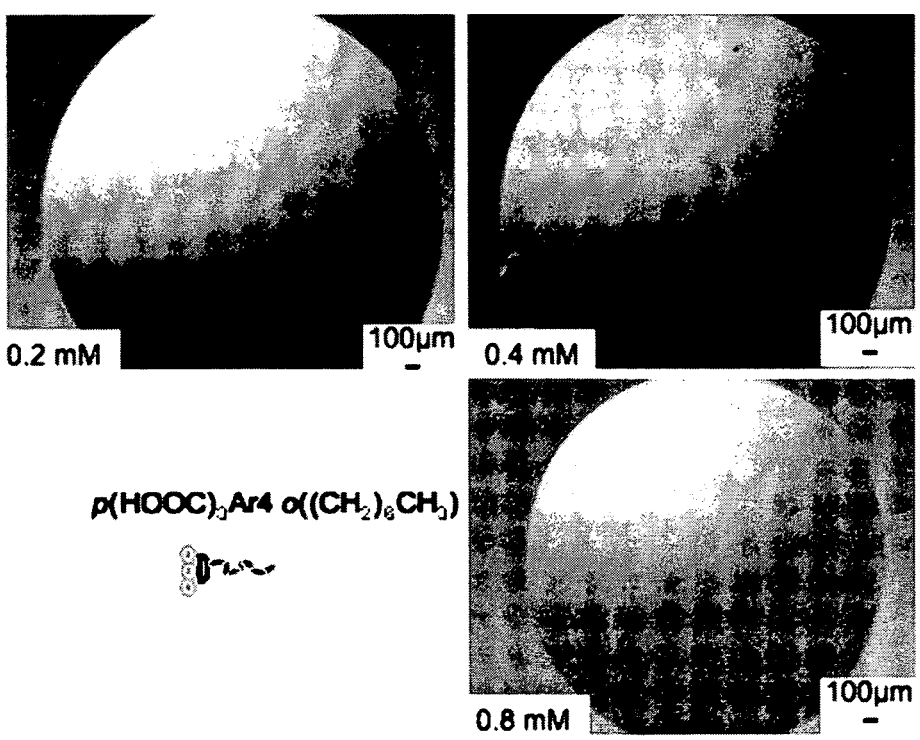
Figure 5C:
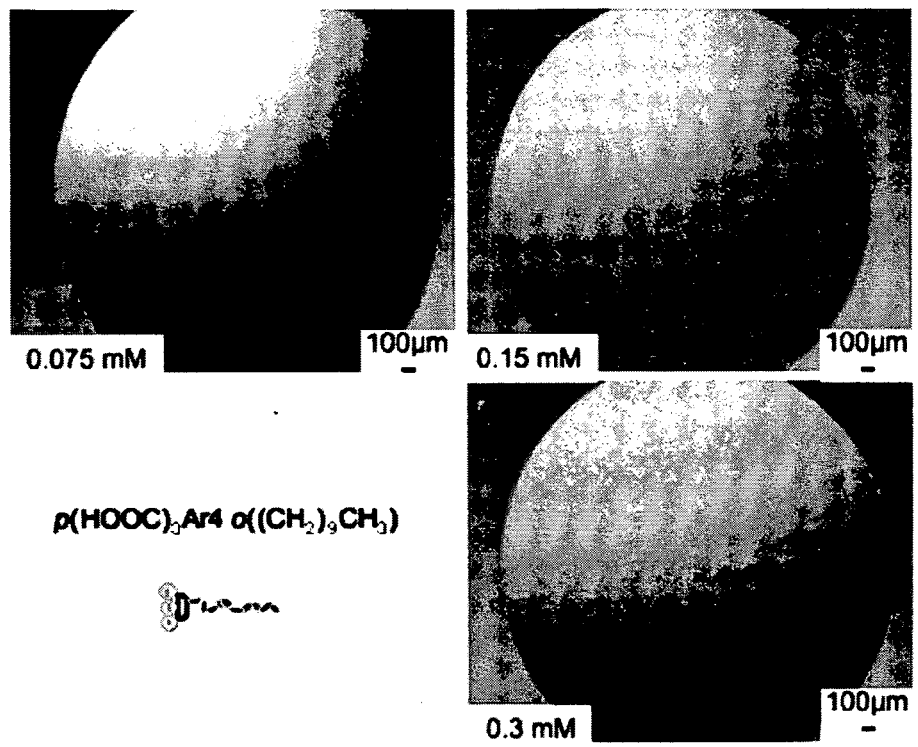
Figure 5D:
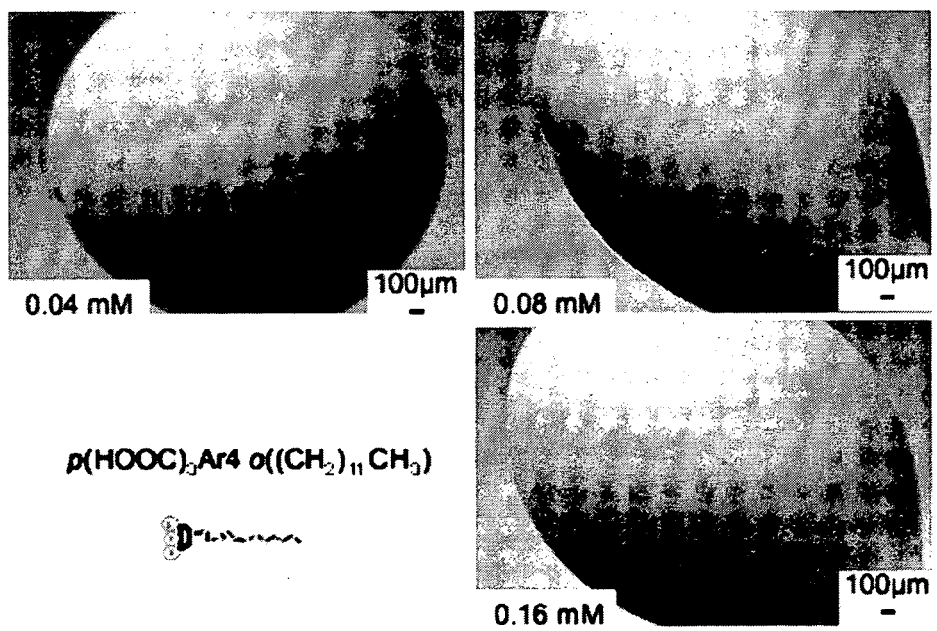

The same conditions are tested for 10 days (FIG. 4), which makes it possible to reveal crystals in the drops comprising the longest calixarene derivatives, whereas they are still not formed in their absence.

Example 5

Crystallization Tests without Proteins (Control)

The possibility exists that the crystals are not those produced with $H_6BmrA$ but with the calixarene derivatives themselves. To test this, the same crystallization conditions were reproduced, this time without adding protein. FIG. 5 shows that no crystals appear. They are thus indeed crystals of protein nature that are obtained in the preceding examples.

Example 6

Functional Reconstitution of $H_6BmrA$ after Treatment with $p(HOOC)_3Ar4\ o((CH_2)_6CH_3)$ ("C4C7")

Figure 6A:
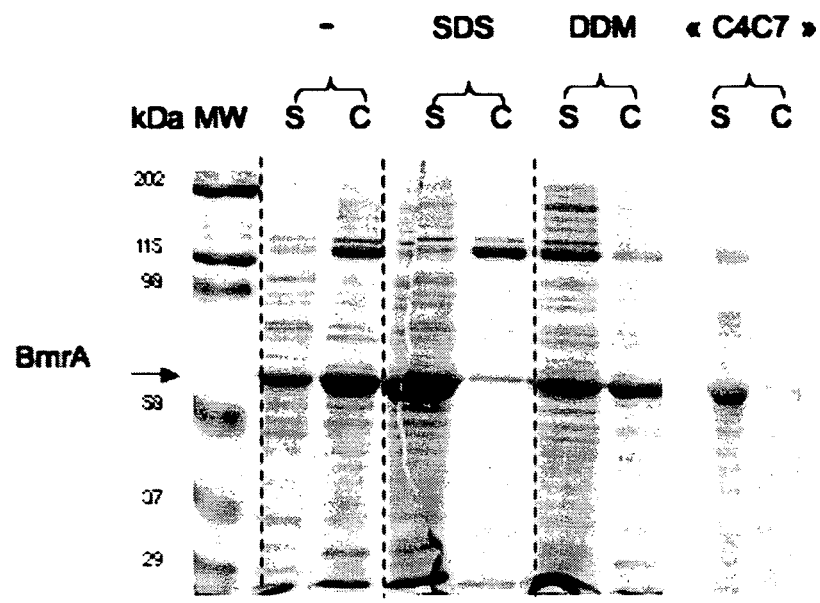
FIG. 6A is a chromatograph of $H_6BmrA$, extracted either without detergent (−), or with a non-denaturing detergent such as dodecyl maltoside (DDM), or with a denaturing detergent such as sodium dodecyl sulfate (SDS), or with a calixarene derivative p(HOOC)$_3$Ar4 o((CH$_2$)$_6$CH$_3$) (C4C7). After 2 hours at 4° C., the suspension is centrifuged and the supernatant (S) and the pellet (P) are deposited on 10% SDS-PAGE gel and stained with Coomassie blue. The supernatant is then dialyzed in the presence of lipids in order simultaneously to remove the detergent and to enable the protein to regain a lipid environment, which is essential for its enzymatic activity.
Figure 6B:
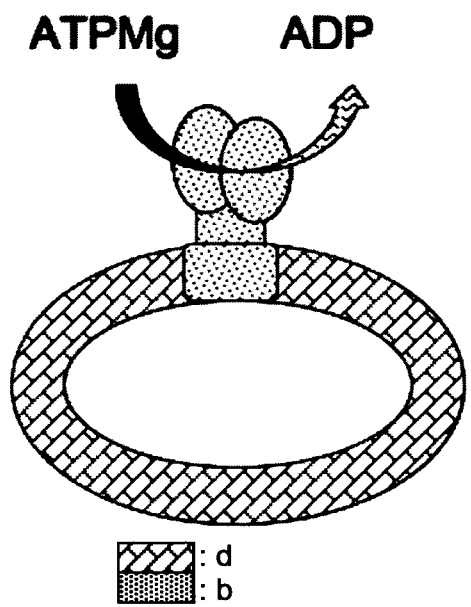
FIG. 6B represents a model of membrane protein hydrolyzing ATP to ADP in the presence of magnesium (Mg), where the letter "b" represents a membrane protein and the letter "d" represents a cell membrane.
Figure 6C:
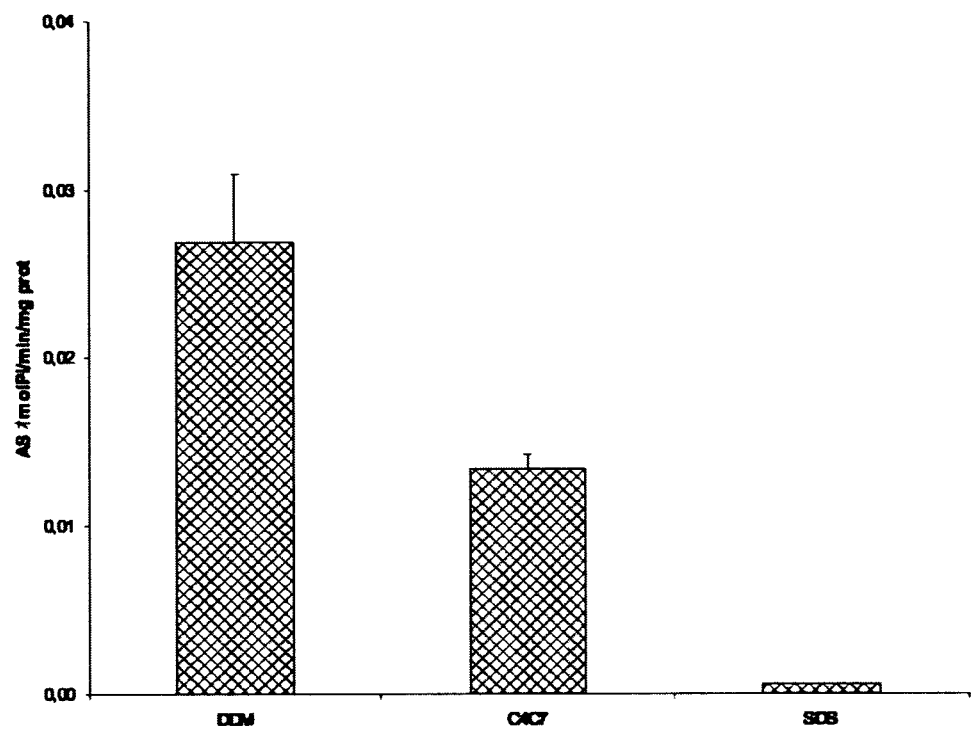
FIG. 6C represents the specific activity (SA) of $H_6BmrA$ in µmol Pi/min/mg prot, when it is extracted either with dodecyl maltoside (DDM), or with sodium docecyl sulfate (SDS), or with a calixarene derivative p(HOOC)$_3$Ar4 o((CH$_2$)$_6$CH$_3$) (C4C7).

The calixarene derivatives used in the present invention are not deleterious to the enzymatic activity of the protein $H_6BmrA$. This is illustrated with the derivative $p(HOOC)_3Ar4\ o((CH_2)_6CH_3)$, which has surfactant activity and allows extraction of the protein. As shown in FIG. 6, the protein conserves its activity after the extraction/reconstitution phase, as with a mild detergent such as dodecyl maltoside (DDM). Conversely, the use of sodium dodecyl sulfate (SDS), a denaturing detergent used for unfolding proteins, does not allow functional reconstitution.

Example 7

Figure 7:
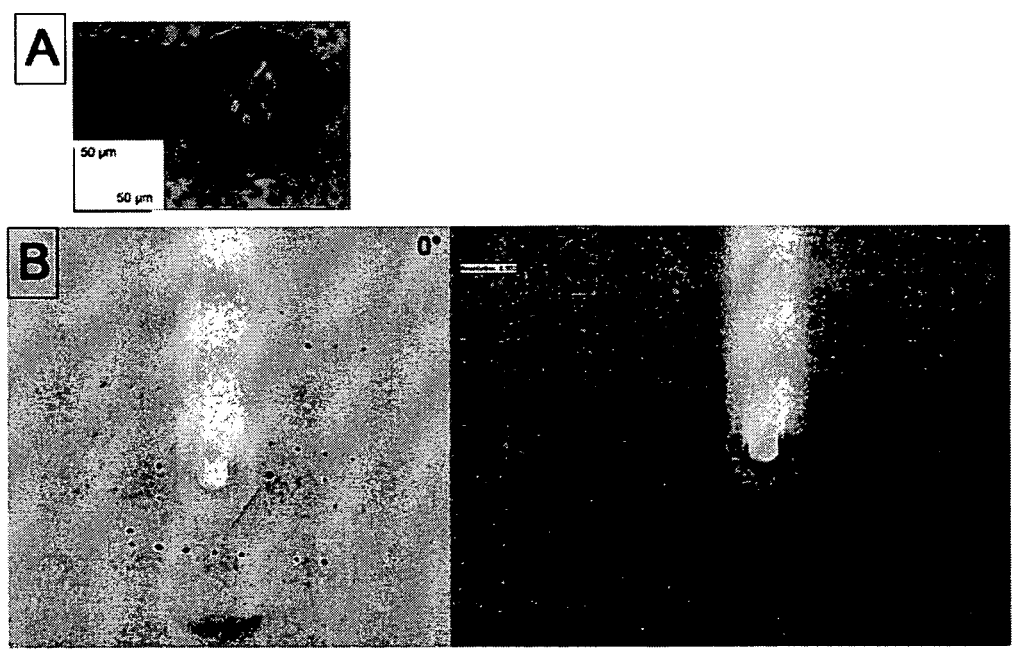
FIG. 7 represents: A.: a crystal of $H_6BmrA$ obtained in the presence of 1 mM p(HOOC)$_3$Ar4 o((CH$_2$)$_2$CH$_3$). B. and C.: ESRF ID23-2 collection at 0° (B) and 90° (C), of the diffraction marks obtained with a crystal of $H_6BmrA$ obtained in the presence of 1 mM p(HOOC)$_3$Ar4o((CH$_2$)$_2$CH$_3$).

ESRF (European Synchrotron Radiation Facility) Synchrotron Test of the Crystal of $H_6BmrA$ in the Presence of $p(HOOC)_3Ar4\ o((CH_2)_2CH_3)$ Some of the crystals that were produced in FIG. 3 were tested on the ESRF synchrotron on the ID23-2 microfocus line and the diffraction images generated with an ADSC Quantum 315R CCD detector. As illustrated in FIG. 7, one of them made it possible to obtain a typical diffraction image of a protein, with indexation compatible with a monoclinic crystal of mesh: a=56 Å, b=254 Å, c=128 Å, alpha=90°, beta=108°, gamma=90°.

Figure 8A:
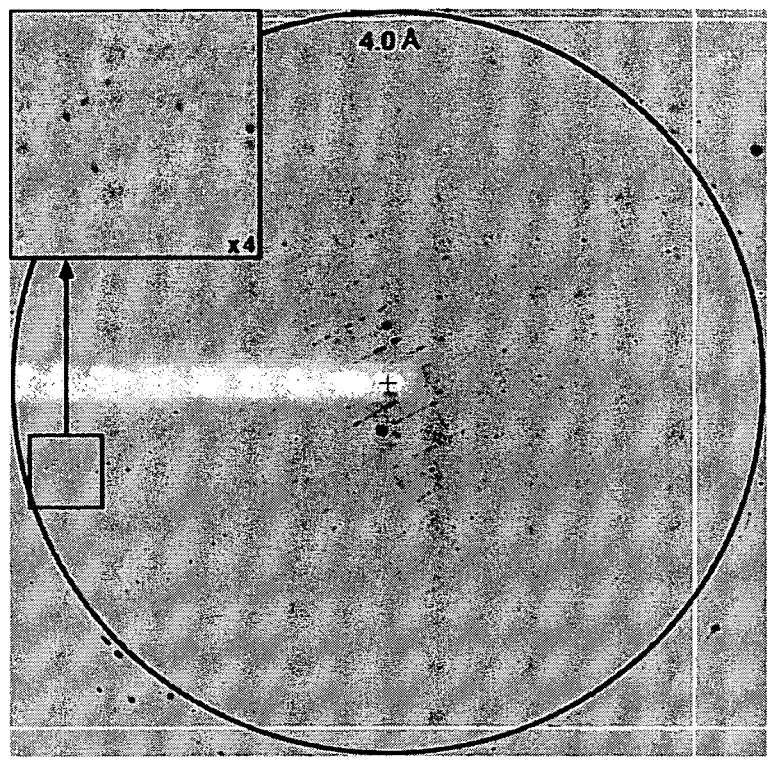
FIG. 8A represents diffraction marks obtained with a crystal of $H_6BmrA$ obtained in the presence of 1 mM p(HOOC)$_3$Ar4 o((CH$_2$)$_2$CH$_3$).
Figure 8B:
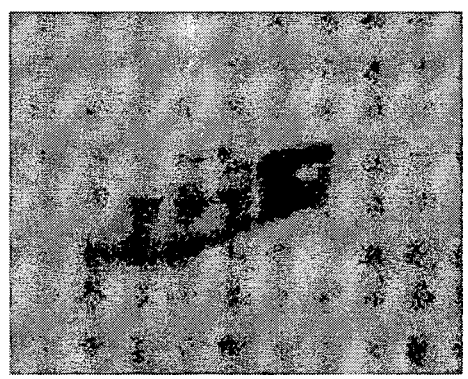
FIG. 8B represents a crystal of $H_6BmrA$ obtained in the presence of 1 mM p(HOOC)$_3$Ar4 o((CH$_2$)$_2$CH$_3$).

The same experiment was repeated on the ID23-1 microfocus line. FIG. 8 shows a diffraction image of the crystal of $H_6BmrA$ obtained.

Example 8

Example of a Crystallization Kit

A crystallization kit is prepared, comprising a solution comprising at least one calixarene derivative defined above.

This kit may also comprise instructions for use, a suitable washing buffer, or any other suitable solution or device, or a combination of these components.

These experiments demonstrate that the present invention is highly efficient for the crystallization of polar and/or positively charged molecules, especially membrane proteins.

The present invention thus forms a remarkable tool, especially for the structural determination at the atomic scale of these molecules.

LIST OF REFERENCES

1. Caffrey M. (2003) Membrane protein crystallization. *J Struct Biol* 142, 108-32.
2. Garavito R. M. and Ferguson-Miller S. (2001) Detergents as Tools in Membrane Biochemistry. *J Biol Chem* 276, 32403-6.
3. Nollert P. (2005) Membrane protein crystallization in amphiphile phases: practical and theoretical considerations. *Prog Biophys Mol Biol* 88, 339-57.

4. Lundstrom K. (2004) Structural genomics on membrane proteins: the MePNet approach. *Curr Opin Drug Discov Devel* 7, 342-6.
5. Dean M., Hamon Y. and Chimini G. (2001) The human ATP-binding cassette (ABC) transporter superfamily. *J Lipid Res* 42, 1007-17.
6. Efferth T. (2003) Adenosine triphosphate-binding cassette transporter genes in ageing and age-related diseases. *Ageing Res Rev* 2, 11-24.
7. Kim R. B. (2003) Drug transporters in HIV Therapy. *Top HIV Med* 11, 136-9.
8. Rajagopal A. and Simon S. M. (2003) Subcellular localization and activity of multidrug resistance proteins. *Mol Biol Cell* 14, 3389-99.
9. Boumendjel A., Baubichon-Cortay H., Trompier D., Perrotton T. and Di Pietro A. (2005) Anticancer multidrug resistance mediated by MRP1: recent advances in the discovery of reversal agents. *Med Res Rev* 25, 453-72.
10. Frelet A. and Klein M. (2006) Insight in eukaryotic ABC transporter function by mutation analysis. *FEBS Lett* 580, 1064-84.
11. Shirasaka Y., Onishi Y., Sakurai A., Nakagawa H., Ishikawa T. and Yamashita S. (2006) Evaluation of Human P-Glycoprotein (MDR1/ABCB1) ATPase Activity Assay Method by Comparing with in Vitro Transport Measurements: Michaelis-Menten Kinetic Analysis to Estimate the Affinity of P-Glycoprotein to Drugs. *Biol Pharm Bull* 29, 2465-71.
12. Szakacs G., Paterson J. K., Ludwig J. A., Booth-Genthe C. and Gottesman M. M. (2006) Targeting multidrug resistance in cancer. *Nat Rev Drug Discov* 5, 219-34.
13. Enokizono J., Kusuhara H., Ose A., Schinkel A. H. and Sugiyama Y. (2008) Quantitative Investigation of the Role of Breast Cancer Resistance Protein (Bcrp/Abcg2) in Limiting Brain and Testis Penetration of Xenobiotic Compounds. *Drug Metab Dispos*, dmd.107.019257.
14. McPherson A. and Cudney B. (2006) Searching for silver bullets: an alternative strategy for crystallizing macromolecules. *J Struct Biol* 156, 387-406.
15. Chami M., Steinfels E., Orelle C., Jault J. M., Di Pietro A., Rigaud J. L. and Marco S. (2002) Three-dimensional structure by cryo-electron microscopy of YvcC, an homodimeric ATP-binding cassette transporter from *Bacillus subtilis. J Mol Biol* 315, 1075-85.
16. Smith P. K., Krohn R. I., Hermanson G. T., Mallia A. K., Gartner F. H., Provenzano M. D., Fujimoto E. K., Goeke N. M., Olson B. J. and Klenk D. C. (1985) Measurement of protein using bicinchoninic acid. *Anal Biochem* 150, 76-85.
17. Laemmli U. K. (1970) Cleavage of structural proteins during the assembly of the head of bacteriophage T4. *Nature* 227, 680-5.
18. Lenoir G., Menguy T., Corre F., Montigny C., Pedersen P. A., Thinès D., le Maire M. and Falson P. (2002) Overproduction in yeast and rapid and efficient purification of the rabbit SERCA1a $Ca^{2+}$-ATPase. *Biochim Biophys Acta* 1560, 67-83.

---

The invention claimed is:

1. A process for the crystallization of a polar and/or positively charged molecule, comprising a step of placing in contact:
   a. an aqueous solution comprising a polar and/or positively charged molecule to be crystallized, and
   b. at least one calix[n]arene derivative substituted with at least one acid function on one face and at least one variable-length aliphatic chain on the other face, wherein said polar and/or positively charged molecule is selected from the group consisting of proteins, protein complexes, protein domains, glycoproteins, phosphoglycoproteins, and protein fragments.

2. The process according to claim 1, in which the at least one calix[n]arene derivative corresponds to formula (I) below:

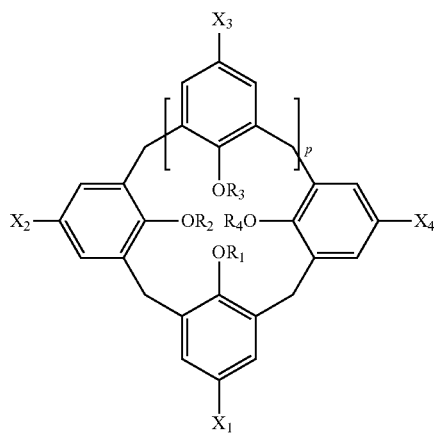

(I)

in which:
p is equal to 1, 3, 5 or 6;
$R^1$, $R^2$, $R^3$ and $R^4$ represent, independently of each other, a hydrogen, a group —$(C_mH_{2m+1})$ or a linear or branched alkene group, in which m is an integer ranging from 1 to 12 or is equal to 16 or 18;
$X^1$, $X^2$, $X^3$ and $X^4$ represent, independently of each other, a hydrogen atom, a carboxylic group or a group —$(CH_2)_y$—COOH in which y is an integer ranging from 1 to 12, or a benzoic acid.

3. The process according to claim 1, in which the at least one calix[n]arene derivative corresponds to formula (I) in which:
p is an integer equal to 1;
one radical from among $R^1$, $R^2$, $R^3$ and $R^4$ represents a linear or branched group —$(C_mH_{2m+1})$ in which m is an integer between 1 and 12 inclusive or is equal to 16 or 18;
three radicals from among $R^1$, $R^2$, $R^3$ and $R^4$ represent a hydrogen atom;
one radical from among $X^1$, $X^2$, $X^3$ and $X^4$ represents a hydrogen atom;
three radicals from among $X^1$, $X^2$, $X^3$ and $X^4$ represent a carboxylic group or a group —$(CH_2)_y$—COOH in which y is an integer ranging from 1 to 12.

4. The process according to claim 2 or 3, in which the group —(CmH2m+1) is selected from the group consisting of methyl, ethyl, propyl, butyl, pentyl, hexyl, heptyl, octyl, nonyl, decyl, undecyl and dodecyl groups.

5. The process according to claim 1, in which the polar and/or positively charged molecule is a membrane protein or a soluble protein.

6. The process according to claim 1, in which the polar and/or positively charged molecule is selected from the group consisting of protein G receptors, channels, symporters, antiporters, electron transporters, protons, anion pumps, cation pumps, metal pumps, peptide pumps and efflux pumps of the BmrA type.

7. The process according to claim 1, in which the placing in contact is performed at a pH of between 5.0 and 14.

8. The process according to claim 1, in which the placing in contact is performed at a temperature of between −40° C. and 80° C.

9. The process according to claim 1, in which the placing in contact is performed at a calixarene concentration of between 1 nM and 100 mM.

* * * * *

SEQUENCE LISTING

```
<160> NUMBER OF SEQ ID NOS: 2

<210> SEQ ID NO 1
<211> LENGTH: 589
<212> TYPE: PRT
<213> ORGANISM: Bacillus subtilis

<400> SEQUENCE: 1

Met Pro Thr Lys Lys Gln Lys Ser Lys Ser Lys Leu Lys Pro Phe Phe
1               5                   10                  15

Ala Leu Val Arg Arg Thr Asn Pro Ser Tyr Gly Lys Leu Ala Phe Ala
                20                  25                  30

Leu Ala Leu Ser Val Val Thr Thr Leu Val Ser Leu Leu Ile Pro Leu
            35                  40                  45

Leu Thr Lys Gln Leu Val Asp Gly Phe Ser Met Ser Asn Leu Ser Gly
        50                  55                  60

Thr Gln Ile Gly Leu Ile Ala Leu Val Phe Phe Val Gln Ala Gly Leu
65                  70                  75                  80

Ser Ala Tyr Ala Thr Tyr Ala Leu Asn Tyr Asn Gly Gln Lys Ile Ile
                85                  90                  95

Ser Gly Leu Arg Glu Leu Leu Trp Lys Lys Leu Ile Lys Leu Pro Val
                100                 105                 110

Ser Tyr Phe Asp Thr Asn Ala Ser Gly Glu Thr Val Ser Arg Val Thr
            115                 120                 125

Asn Asp Thr Met Val Val Lys Glu Leu Ile Thr Thr His Ile Ser Gly
        130                 135                 140

Phe Ile Thr Gly Ile Ile Ser Val Ile Gly Ser Leu Thr Ile Leu Phe
145                 150                 155                 160

Ile Met Asn Trp Lys Leu Thr Leu Leu Val Leu Val Val Pro Leu
                165                 170                 175
```

-continued

```
Ala Ala Leu Ile Leu Val Pro Ile Gly Arg Lys Met Phe Ser Ile Ser
            180                 185                 190

Arg Glu Thr Gln Asp Glu Thr Ala Arg Phe Thr Gly Leu Leu Asn Gln
        195                 200                 205

Ile Leu Pro Glu Ile Arg Leu Val Lys Ala Ser Asn Ala Glu Asp Val
    210                 215                 220

Glu Tyr Gly Arg Gly Lys Met Gly Ile Ser Ser Leu Phe Lys Leu Gly
225                 230                 235                 240

Val Arg Glu Ala Lys Val Gln Ser Leu Val Gly Pro Leu Ile Ser Leu
                245                 250                 255

Val Leu Met Ala Ala Leu Val Ala Val Ile Gly Tyr Gly Gly Met Gln
            260                 265                 270

Val Ser Ser Gly Glu Leu Thr Ala Gly Ala Leu Val Ala Phe Ile Leu
        275                 280                 285

Tyr Leu Phe Gln Ile Ile Met Pro Met Gly Gln Ile Thr Thr Phe Phe
    290                 295                 300

Thr Gln Leu Gln Lys Ser Ile Gly Ala Thr Glu Arg Met Ile Glu Ile
305                 310                 315                 320

Leu Ala Glu Glu Glu Asp Thr Val Thr Gly Lys Gln Ile Glu Asn
                325                 330                 335

Ala His Leu Pro Ile Gln Leu Asp Arg Val Ser Phe Gly Tyr Lys Pro
            340                 345                 350

Asp Gln Leu Ile Leu Lys Glu Val Ser Ala Val Ile Glu Ala Gly Lys
        355                 360                 365

Val Thr Ala Ile Val Gly Pro Ser Gly Gly Lys Thr Thr Leu Phe
    370                 375                 380

Lys Leu Leu Glu Arg Phe Tyr Ser Pro Thr Ala Gly Thr Ile Arg Leu
385                 390                 395                 400

Gly Asp Glu Pro Val Asp Thr Tyr Ser Leu Glu Ser Trp Arg Glu His
                405                 410                 415

Ile Gly Tyr Val Ser Gln Glu Ser Pro Leu Met Ser Gly Thr Ile Arg
            420                 425                 430

Glu Asn Ile Cys Tyr Gly Leu Glu Arg Asp Val Thr Asp Ala Glu Ile
        435                 440                 445

Glu Lys Ala Ala Glu Met Ala Tyr Ala Leu Asn Phe Ile Lys Glu Leu
    450                 455                 460

Pro Asn Gln Phe Asp Thr Glu Val Gly Glu Arg Gly Ile Met Leu Ser
465                 470                 475                 480

Gly Gly Gln Arg Gln Arg Ile Ala Ile Ala Arg Ala Leu Leu Arg Asn
                485                 490                 495

Pro Ser Ile Leu Met Leu Asp Glu Ala Thr Ser Ser Leu Asp Ser Gln
            500                 505                 510

Ser Glu Lys Ser Val Gln Gln Ala Leu Glu Val Leu Met Glu Gly Arg
        515                 520                 525

Thr Thr Ile Val Ile Ala His Arg Leu Ser Thr Val Val Asp Ala Asp
    530                 535                 540

Gln Leu Leu Phe Val Glu Lys Gly Glu Ile Thr Gly Arg Gly Thr His
545                 550                 555                 560

His Glu Leu Met Ala Ser His Gly Leu Tyr Arg Asp Phe Ala Glu Gln
                565                 570                 575

Gln Leu Lys Met Asn Ala Asp Leu Glu Asn Lys Ala Gly
            580                 585
```

```
<210> SEQ ID NO 2
<211> LENGTH: 10
<212> TYPE: PRT
<213> ORGANISM: Artificial Sequence
<220> FEATURE:
<223> OTHER INFORMATION: Description of Artificial Sequence: Synthetic
      sequence added to the N-terminal extremity of BmrA in order
      to purify the protein by metal partition chromatography

<400> SEQUENCE: 2

Met Ser Ser Ser His His His His His His
1               5                   10
```